US012804978B2

(12) United States Patent
Curatola

(10) Patent No.: US 12,804,978 B2
(45) Date of Patent: Nov. 17, 2026

(54) GALLIUM NITRIDE POWER TRANSISTOR

(71) Applicant: HUAWEI TECHNOLOGIES CO., LTD., Shenzhen (CN)

(72) Inventor: Gilberto Curatola, Nuremberg (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 435 days.

(21) Appl. No.: 18/338,125

(22) Filed: Jun. 20, 2023

(65) Prior Publication Data

US 2023/0335597 A1 Oct. 19, 2023

Related U.S. Application Data

(63) Continuation of application No. PCT/EP2020/087350, filed on Dec. 20, 2020.

(51) Int. Cl.
*H10D 64/00* (2025.01)
*H10D 30/67* (2025.01)
(Continued)

(52) U.S. Cl.
CPC ..... *H10D 62/8503* (2025.01); *H10D 30/6738* (2025.01); *H10D 30/675* (2025.01);
(Continued)

(58) Field of Classification Search
CPC ........... H10D 62/8503; H10D 30/6738; H10D 30/675; H10D 30/87; H10D 62/103;
(Continued)

(56) References Cited

U.S. PATENT DOCUMENTS 9,472,633 B1 * 10/2016 Schuette .............. H10D 64/411
9,614,069 B1 * 4/2017 Lu ...................... H10D 30/4732
(Continued)

FOREIGN PATENT DOCUMENTS

CN 106298907 A 1/2017
EP 2385544 A2 11/2011
(Continued)

OTHER PUBLICATIONS

Sayadi et al., "Threshold Voltage Instability in p-GaN Gate AlGaN/GaN HFETs," IEEE Transactions on Electron Devices total 7 pages, Institute of Electrical and Electronics Engineers, New York, New York (Apr. 27, 2018).

(Continued)

*Primary Examiner* — Sheikh Maruf
(74) *Attorney, Agent, or Firm* — Leydig, Voit & Mayer, Ltd

(57) ABSTRACT

The present disclosure relates to a Gallium Nitride (GaN) power transistor, comprising: a buffer layer; a barrier layer deposited on the buffer layer, wherein a gate region is formed on top of the barrier layer; a p-type doped GaN layer deposited on the barrier layer at the gate region; and a metal gate layer deposited on top of the p-type doped GaN layer, wherein the metal gate layer is contacting the p-type doped GaN layer to form a Schottky barrier, wherein a thickness of the p-type doped GaN layer, a metal type of the metal gate layer and a p-type doping concentration of the p-type doped GaN layer are based on a known relationship of a pGaN Schottky gate depletion region thickness with respect to a p-type doping concentration and a gate metal type.

20 Claims, 6 Drawing Sheets

(51) Int. Cl.
*H10D 30/87* (2025.01)
*H10D 62/10* (2025.01)
*H10D 62/815* (2025.01)
*H10D 62/85* (2025.01)
*H10D 64/64* (2025.01)

(52) U.S. Cl.
CPC ........... *H10D 30/87* (2025.01); *H10D 62/103* (2025.01); *H10D 62/104* (2025.01); *H10D 62/8171* (2025.01); *H10D 62/85* (2025.01); *H10D 64/64* (2025.01)

(58) Field of Classification Search
CPC ............. H10D 62/104; H10D 62/8171; H10D 62/85; H10D 64/64; H10D 30/475; H10D 62/852; H10D 64/256; H10D 62/343
USPC ............................................................. 257/76
See application file for complete search history.

(56) References Cited

U.S. PATENT DOCUMENTS 10,818,787 B1* 10/2020 Banerjee .............. H10D 64/411
2005/0151255 A1* 7/2005 Ando .................... H10D 30/472 257/E29.253
2006/0273347 A1* 12/2006 Hikita ................ H10D 30/4732 257/E29.252
2006/0289891 A1* 12/2006 Hutchins .............. H10H 20/812 257/E21.407
2007/0272945 A1* 11/2007 Matsuo ............. H10D 30/4732 257/E29.078
2010/0258841 A1* 10/2010 Lidow .................. H10D 30/015 257/192
2010/0258842 A1* 10/2010 Lidow ................ H10D 30/4755 257/192
2010/0258843 A1* 10/2010 Lidow .................... H10D 30/47 257/E21.403
2010/0258848 A1* 10/2010 Lidow .................. H10D 30/801 257/288
2012/0193637 A1* 8/2012 Kalnitsky ............ H10D 30/015 257/E21.451
2013/0001516 A1* 1/2013 Hebard ................ H10D 30/475 257/29
2013/0043492 A1* 2/2013 Takizawa ............. H10D 30/015 257/77
2013/0112986 A1* 5/2013 Hsiung ................ H10D 30/015 257/E21.403
2013/0153923 A1* 6/2013 Decoutere ............ H10D 30/015 257/194
2013/0234278 A1* 9/2013 Hagleitner ......... H10D 30/6738 438/575
2013/0248873 A1* 9/2013 Kuraguchi ......... H10D 30/0277 257/192
2013/0320402 A1* 12/2013 Tsai ..................... H10D 10/821 257/E21.403
2014/0001640 A1* 1/2014 Nishizawa ........... H10D 30/015 257/773
2014/0203288 A1* 7/2014 Hsiung ................ H10D 30/015 438/400
2014/0231876 A1* 8/2014 Tsai ....................... H10D 84/05 257/195
2014/0264381 A1* 9/2014 Radulescu ........... H10D 30/015 257/77
2014/0306181 A1* 10/2014 Shin .................. H01L 21/02241 257/20
2015/0279961 A1* 10/2015 Huang ................... H10D 8/043 438/478
2015/0357457 A1* 12/2015 Ritenour ................ H10D 30/60 257/76
2016/0013285 A1* 1/2016 Mikulics ............. H10D 30/061 257/734
2016/0020296 A1* 1/2016 Hurkx .................. H10D 30/675 438/573
2016/0049347 A1* 2/2016 Negoro ................ H10D 30/475 257/472
2016/0181364 A1* 6/2016 Stewart ................ H10D 30/021 257/192
2016/0380091 A1 12/2016 Okawa
2017/0040312 A1* 2/2017 Curatola .............. H10D 30/015
2017/0092752 A1* 3/2017 Lu ...................... H10D 62/8164
2017/0125562 A1* 5/2017 Prechtl ............... H10D 62/8503
2018/0219106 A1* 8/2018 Odnoblyudov .... H10D 62/8503
2020/0176595 A1* 6/2020 Otake .................. H10D 30/475
2020/0235218 A1* 7/2020 Stoffels .............. H10D 30/6738
2020/0303500 A1* 9/2020 Loubet ............... H10D 30/6735
2020/0335617 A1* 10/2020 Banerjee .............. H10D 62/343
2021/0074702 A1* 3/2021 Le ...................... H10D 62/8503
2021/0083073 A1* 3/2021 Liu ...................... H10D 30/015
2021/0119028 A1* 4/2021 Roizin .............. H01L 21/02381
2021/0134957 A1* 5/2021 Hsu ...................... H10D 30/475
2021/0151594 A1* 5/2021 Wong .................. H01L 23/3171
2021/0265364 A1* 8/2021 Huang ................... H10B 43/20
2021/0359123 A1* 11/2021 Yang ....................... H10D 30/60
2022/0199795 A1* 6/2022 Huang ................... H10D 64/62
2022/0238706 A1* 7/2022 Oh ......................... H10D 62/85
2022/0254894 A1* 8/2022 Constant .............. H10D 30/475
2022/0376083 A1* 11/2022 Zhang .................. H10D 62/343
2022/0376100 A1* 11/2022 Yang .................... H10D 62/115
2023/0170407 A1* 6/2023 Kawai ................ H10D 30/4732 257/76

FOREIGN PATENT DOCUMENTS

JP 2011066464 A 3/2011
JP 2014212317 A 11/2014
JP 2017017071 A 1/2017
JP 2020088344 A 6/2020
KR 20140124273 A 10/2014
KR 20170001612 A 1/2017

OTHER PUBLICATIONS

Jones et al., “Application-Based Review of GaN HFETs,” 2014 IEEE Workshop on Wide Bandgap Power Devices and Applications, XP032689875, pp. 24-29, Institute of Electrical and Electronics Engineers, New York, New York (Oct. 13, 2014).

* cited by examiner

400

GALLIUM NITRIDE POWER TRANSISTOR

CROSS-REFERENCE TO RELATED APPLICATIONS

This application is a continuation of International Application No. PCT/EP2020/087350, filed on Dec. 20, 2020, the disclosure of which is hereby incorporated by reference in its entirety.

FIELD

The present disclosure relates to the field of Gallium Nitride (GaN) technology for power device applications. In particular, the present disclosure relates to a GaN power transistor, in particular a GaN power field effect transistor (FET) with stable pGaN Schottky operation and a metal-semiconductor junction of such a GaN power transistor.

BACKGROUND

Intensive effort has been taken in the last 15-20 years in the semiconductor industry for the development of Gallium Nitride technology as possible replacement for conventional Si-based field effect transistors. The usage of wide bandgap materials offers the possibility of unprecedented performance improvement both at device level and system level. Today, enhancement mode GaN Power FETs are becoming a reality and several main semiconductor manufacturers already have products in the market. The most mature GaN device concept, being utilized by the vast majority of players, is the pGaN normally-off concept. Two general approaches are today being followed for the fabrication of normally-off pGaN power FETs. The main difference consists in the manufacturing strategy for the metal/pGaN interface. The two possible approaches are: i) Ohmic interface; ii) Schottky interface. In the Schottky approach a massive DC gate current reduction can be achieved, however, at the expense of two main drawbacks, which are threshold voltage instabilities and poor gate reliability.

SUMMARY

The present disclosure provides a solution for a GaN power transistor without the above described drawbacks of threshold voltage instabilities and poor gate reliability or at least a GaN power transistor in which threshold voltage instabilities and poor gate reliability issues are significantly reduced.

The embodiments of the disclosure provide exemplary guideline optimization for the Schottky gate module of a p-Gate of a GaN power transistor.

In particular, a set of precise relationship between the different dimensions and doping concentration of a pGaN gate module will be provided in this disclosure that optimizes the overall performance and allows to solve the main issues of state-of-the-art pGaN Schottky gate, i.e. threshold voltage instabilities and gate reliability.

In this disclosure, a fully depleted pGaN Schottky Gate solution is presented that can be achieved by properly dimensioning the pGaN gate geometry in relation to the p-type doping concentration, for example achieved my means of Magnesium doping though any other doping can used as well.

During tests with different parameters, it was found that a suitable guideline optimization strategy for a pGaN Schottky gate module can be summarized as follows:

(1) pGaN thickness <65 nm (2) p-type doping concentration: [1e18 $cm^{-3}$-1e19 $cm^{-3}$]

(3) Metal type of the metal gate: Al, Ti, TiN, Au, Pd, Ni, W or any combination thereof in a stacked way The disclosure presents a new pGaN Schottky gate module concept, suited for enhancement mode GaN-based power transistor, which allows to have the following advantages: Normally-off operation; Stable threshold voltage and suppression of dynamic instabilities that characterize conventional pGaN Schottky gate approaches; and improved gate reliability thanks to strong reduction in peak electric field at the metal/pGaN interface and in pGaN bulk.

In order to describe the invention in detail, the following terms, abbreviations and notations will be used:

GaN Gallium-Nitride

FET Field Effect Transistor pGaN p-doped GaN

Al GaN Aluminum Gallium-Nitride

2DEG 2-dimensional electron gas

HV high voltage (operation), e.g. >600 V

MV medium voltage (operation), e.g. 200-600 V $V_{TH}$ threshold voltage

TDDB time dependent dielectric breakdown

In this disclosure, two approaches in manufacturing the metal/pGaN interface are described, the Ohmic interface approach and the Schottky interface approach.

In the Ohmic interface approach, the interface between metal gate and pGaN surface is nearly ideal. This translates into a large DC current that sustains the device operation during on-state conditions, but also complicates the driving strategy and largely increases the driving losses.

The Ohmic interface approach provides the following advantages: (i) pGaN node is tidily connected to the gate metal terminal, thus the device is less prone to $V_{TH}$ instability; (ii) Good reliability: Gate breakage is due to thermal runaway when large DC current flows through the gate; (iii) Large amount of hole injected from gate improves dynamic effects.

However, following disadvantages are achieved by the Ohmic interface approach: (i) Large amount of hole injected into the buffer may require negative off-stage gate voltages; (ii) Hole accumulation might cause tail currents; (iii) Dedicated driving schemes needed: Current driven gate driver, external R-C network; (iv) Large DC gate current results in driving losses; and limits scalability of concept to high voltage (400-600V) and to large $R_{DSON}$ (>30 mOhm).

In the Schottky interface approach, a reverse-biased Schottky diode is inserted in series with the pn-pGaN/AlGaN diode. This allows a massive DC gate current reduction.

The Schottky interface approach provides the following advantages: (i) pGaN node is separated from the gate terminal by a reverse biased Schottky diode; (ii) Low DC gate current is obtained at the expense of $V_{TH}$ instabilities; (iii) Low DC current implies a more difficult dynamic effect optimization due to lower amount of holes injected into the buffer; (iv) Gate module is breaking via a TDDB mechanism (like oxide in Si-MOS devices); (v) Difficult interplay among: dynamic effects, gate reliability and $V_{TH}$ stability.

However, following disadvantages are achieved by the Schottky interface approach: (i) the approach allows self-aligned gate concept resulting in best FOMs (figures of merit) (low $C_{GS}$ and $C_{GS}$); (ii) basically no DC gate current; (iii) the approach allows standard driving schemes like: voltage driven approaches, no external RC networks; (iv) the concept can be used for both HV and MV operation; (v) the concept allows device scaling to very low $R_{DSON}$.

The focus of this disclosure lies on providing optimized guidelines for the Schottky interface approach in order to overcome the above described disadvantages.

According to a first aspect, the disclosure relates to a Gallium Nitride, GaN, power transistor, comprising: a buffer layer; a barrier layer deposited on the buffer layer, wherein a gate region is formed on top of the barrier layer; a p-type doped Gallium Nitride, GaN, layer deposited on the barrier layer at the gate region; and a metal gate layer deposited on top of the p-type doped GaN layer, wherein the metal gate layer is contacting the p-type doped GaN layer to form a Schottky barrier, wherein a thickness of the p-type doped GaN layer, a metal type of the metal gate layer and a p-type doping concentration of the p-type doped GaN layer are based on a known relationship of a pGaN Schottky gate depletion region thickness with respect to a p-type doping concentration and a gate metal type.

Such a GaN power transistor provides a new pGaN Schottky gate module concept, suited for enhancement mode GaN-based power transistor, which allows to have the following advantages: Normally-off operation; Stable threshold voltage and suppression of dynamic instabilities that characterize conventional pGaN Schottky gate approaches; and improved gate reliability thanks to strong reduction in peak electric field at the metal/pGaN interface and in pGaN bulk.

In an exemplary implementation of the GaN power transistor, the thickness of the p-type doped GaN layer is smaller than 65 nanometers.

This provides the following advantages: The thickness of the p-type doped GaN layer affects the selectivity of the etching process for defining the gate region. A thin layer of p-type doped GaN results in a better definition of the gate region by lithography. A further advantage is that minimizing the pGaN layer results in boosting the device transconductance (gm). Further, the device threshold voltage increases with increasing pGaN thickness. Therefore, a thickness of the p-type doped GaN layer smaller than 65 nanometers results in stable threshold voltage of the transistor.

In an exemplary implementation of the GaN power transistor, the metal gate layer is made of one of the following metals: Al, Ti, TiN, Au, Pd, Ni, W or any combination thereof in a stacked way.

This provides the advantage that the different properties of these metals can be advantageously utilized, for example conductivity, ampacity, robustness, durability, acid resistance, electrical properties, etc.

In an exemplary implementation of the GaN power transistor, the p-type doping concentration of the p-type doped GaN layer is within a range of 1e18 $cm^{-3}$ and 1e19 $cm^{-3}$.

When the p-type doping concentration of the p-type doped GaN layer is within such a range, tunneling events of holes injection from the metal layer into the pGaN layer are strongly attenuated. Using a p-type doping concentration in such a range allows a drastic reduction of the static gate current, under positive voltages applied to the gate electrode.

In an exemplary implementation of the GaN power transistor, the p-type doped GaN layer is fully depleted in operation of the GaN power transistor.

When the p-type doped GaN layer is fully depleted, the transistor can be operated with optimized performance at high gate reliability and without showing threshold voltage instabilities.

In an exemplary implementation of the GaN power transistor, the known relationship of the pGaN Schottky gate depletion region thickness with respect to the p-type doping concentration and the gate metal type is based on a predetermined dataset that enables a stable operation of the GaN power transistor.

By using such a predetermined dataset, as for example described in FIG. 4, the overall performance of the GaN power transistor can be optimized.

In an exemplary implementation of the GaN power transistor, the predetermined dataset enables an optimum (or improved) operation of the GaN power transistor with respect to static performance, dynamic performance and gate reliability.

Such a GaN power transistor allows optimum (or improved) operation in normally-off operation with stable threshold voltage, suppression of dynamic instabilities and improved gate reliability thanks to strong reduction in peak electric field at the metal/pGaN interface.

In an exemplary implementation of the GaN power transistor, the GaN power transistor is configured to enable normally-off operation.

This provides the advantage that the normally-off transistor can guarantee a safe operation, for example in power electronics systems.

In an exemplary implementation of the GaN power transistor, the p-type doped GaN layer and the metal gate layer are lithographically defined only in the gate region of the barrier layer.

This provides the advantage that the manufacturing process can be precisely implemented and allows producing GaN power transistors with high gate reliability.

In an exemplary implementation of the GaN power transistor, the buffer layer comprises a GaN layer or an Aluminum Gallium Nitride, AlGaN, layer.

A buffer layer comprising GaN or AlGaN improves electron mobility of the transistor. The buffer layer further reduces reverse leakage currents in the transistor and improves on-off ratios of the transistor.

In an exemplary implementation of the GaN power transistor, the barrier layer comprises an AlGaN layer.

A transistor with such a barrier layer shows improved RF characteristics and DC performance.

In an exemplary implementation of the GaN power transistor, the buffer layer is formed on at least one transition layer that is formed on a Silicon substrate.

Such a power transistor provides improved gate leakage current decrease.

According to a second aspect, the disclosure relates to a metal-semiconductor junction of a Gallium Nitride, GaN, power transistor, the metal-semiconductor junction comprising: a p-type doped GaN layer; and a metal gate layer deposited on top of the p-type doped GaN layer, wherein the metal gate layer is contacting the p-type doped GaN layer to form a Schottky barrier, wherein a p-type doping concentration of the p-type doped GaN layer is within a range of 1e18 $cm^{-3}$ and 1e19 $cm^{-3}$.

Such a metal-semiconductor junction of a GaN power transistor provides the following advantages: Normally-off operation; Stable threshold voltage and suppression of dynamic instabilities that characterize conventional pGaN Schottky gate approaches; and improved gate reliability thanks to strong reduction in peak electric field at the metal/pGaN interface and in pGaN bulk.

When the p-type doping concentration of the p-type doped GaN layer is within the above range, tunneling events of holes injection from the metal layer into the pGaN layer are strongly attenuated. Using a p-type doping concentration in such a range allows a drastic reduction of the static gate current, under positive voltages applied to the gate electrode.

In an exemplary implementation of the metal-semiconductor junction, a thickness of the p-type doped GaN layer is smaller than 65 nanometers.

This provides the following advantages: The thickness of the p-type doped GaN layer affects the selectivity of the etching process for defining the gate region. A thin layer of p-type doped GaN results in a better definition of the gate region by lithography. A further advantage is that minimizing the pGaN layer results in boosting the device transconductance (gm). Further, the device threshold voltage increases with increasing pGaN thickness. Therefore, a thickness of the p-type doped GaN layer smaller than 65 nanometers results in stable threshold voltage of the transistor.

In an exemplary implementation of the metal-semiconductor junction, the metal gate layer is made of one of the following metals: Al, Ti, TiN, Au, Pd, Ni, W or any combination thereof in a stacked way.

This provides the advantage that the different properties of these metals can be advantageously utilized, for example conductivity, ampacity, robustness, durability, acid resistance, electrical properties, etc.

BRIEF DESCRIPTION OF THE DRAWINGS

Further embodiments of the invention will be described with respect to the following figures, in which.

DETAILED DESCRIPTION

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The semiconductor devices and systems described herein may be implemented in wireless communication schemes, in particular communication schemes according to 5G. The described semiconductor devices may be used to produce integrated circuits and/or power semiconductors and may be manufactured according to various technologies. For example, the semiconductor devices may be utilized in logic integrated circuits, analog integrated circuits, mixed signal integrated circuits, optical circuits, memory circuits and/or integrated passives.

A Schottky barrier as described in this disclosure is a potential energy barrier for electrons formed at a metal-semiconductor junction. Schottky barriers have rectifying characteristics, suitable for use as a diode. One of the primary characteristics of a Schottky barrier is the Schottky barrier height. The Schottky barrier height depends on the combination of metal and semiconductor. Not all metal—semiconductor junctions form a rectifying Schottky barrier; a metal—semiconductor junction that conducts current in both directions without rectification, perhaps due to its Schottky barrier being too low, is called an ohmic contact.

Figure 1:
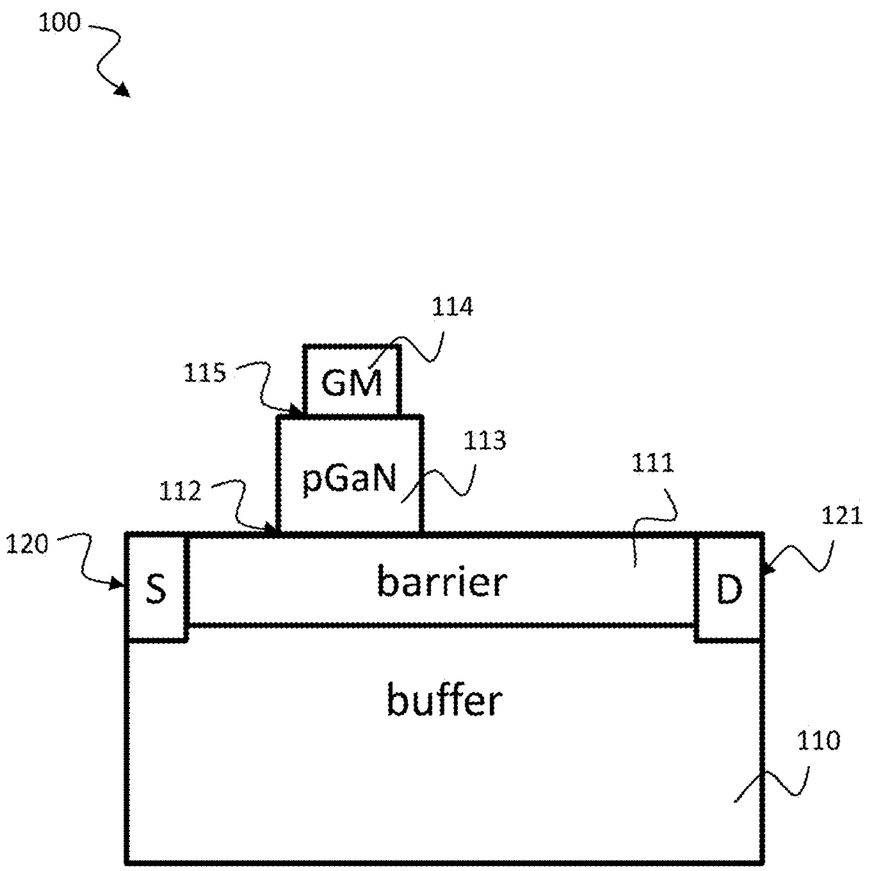
FIG. 1 shows a design of a GaN power transistor 100 with Schottky barrier according to embodiments of the disclosure.

FIG. 1 shows a design of a GaN power transistor 100 with Schottky barrier according to a first example.

Figure 4:
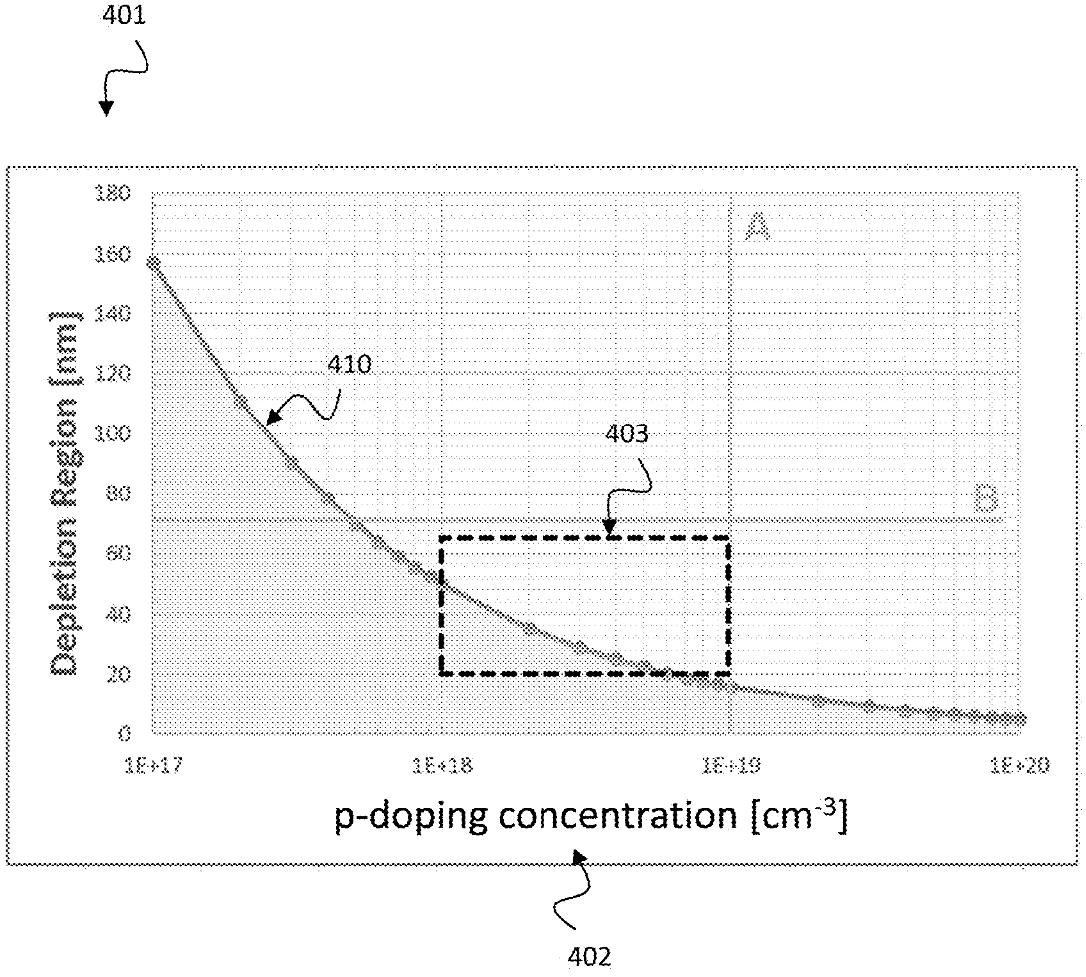
FIG. 4 shows an example of design guidelines according to the disclosure for the Schottky interface with respect to depletion region over doping concentration 400, according to embodiments of the disclosure.

The GaN power transistor 100 comprises a buffer layer 110; a barrier layer 111 deposited on the buffer layer 110, wherein a gate region 112 is formed on top of the barrier layer 111; a p-type doped GaN layer 113 deposited on the barrier layer 111 at the gate region 112; and a metal gate layer 114 deposited on top of the p-type doped GaN layer 113, wherein the metal gate layer 114 is contacting the p-type doped GaN layer 113 to form a Schottky barrier 115. A thickness of the p-type doped GaN layer 113, a metal type of the metal gate layer 114 and a p-type doping concentration of the p-type doped GaN layer 113 are based on a known relationship, e.g. a relationship 400 as shown in FIG. 4, of a pGaN Schottky gate depletion region thickness 401 with respect to a p-type doping concentration 402 and a gate metal type.

A source (S) metal layer 120 and a drain (D) metal layer 121 may be formed laterally to the barrier layer 111. Source metal layer 120 and drain metal layer 121 may be separated by the barrier layer 111 from the pGaN layer 113 and the metal gate layer 114. Source metal layer 120 and drain metal layer 121 may extend to the same height as the barrier layer 111 and hence to a lower level than the metal gate layer 114.

The buffer layer 110 may comprise a GaN layer or an Aluminum Gallium Nitride, AlGaN, layer. The barrier layer 111 may comprise an AlGaN layer.

In one example of the transistor 100, the thickness of the p-type doped GaN layer 113 may be smaller than 65 nanometers.

In one example of the transistor 100, the metal gate layer 114 may be made of one of the following metals: Al, Ti, TiN, Au, Pd, Ni, W or any combination thereof in a stacked way.

In one example of the transistor 100, the p-type doping concentration of the p-type doped GaN layer 113 may be within a range of 1e18 $cm^{-3}$ and 1e19 $cm^{-3}$.

In one example of the transistor 100, the p-type doped GaN layer 113 may be fully depleted in operation of the GaN power transistor 100.

In one example of the transistor 100, the known relationship (e.g. relationship 400 shown in FIG. 4) of the pGaN Schottky gate depletion region thickness 401 with respect to the p-type doping concentration 402 and the gate metal type may be based on a predetermined dataset, e.g. dataset 403 shown in FIG. 4, that enables a stable operation of the GaN power transistor 100.

In one example of the transistor 100, the predetermined dataset enables an optimum (or improved) operation of the GaN power transistor 100 with respect to static performance, dynamic performance and gate reliability.

During tests with different parameters, it was found that a suitable dataset for a pGaN Schottky gate module can be summarized as follows:

(1) pGaN thickness <65 nm (2) p-type doping concentration: [1e18 $cm^{-3}$-1e19 $cm^{-3}$]

(3) Metal type of the metal gate: Al, Ti, TiN, Au, Pd, Ni, W or any combination thereof in a stacked way In one example of the transistor 100, the transistor 100 may be configured to enable normally-off operation.

In one example of the transistor 100, the p-type doped GaN layer 113 and the metal gate layer 114 may be lithographically defined only in the gate region of the barrier layer 111.

Figure 2:
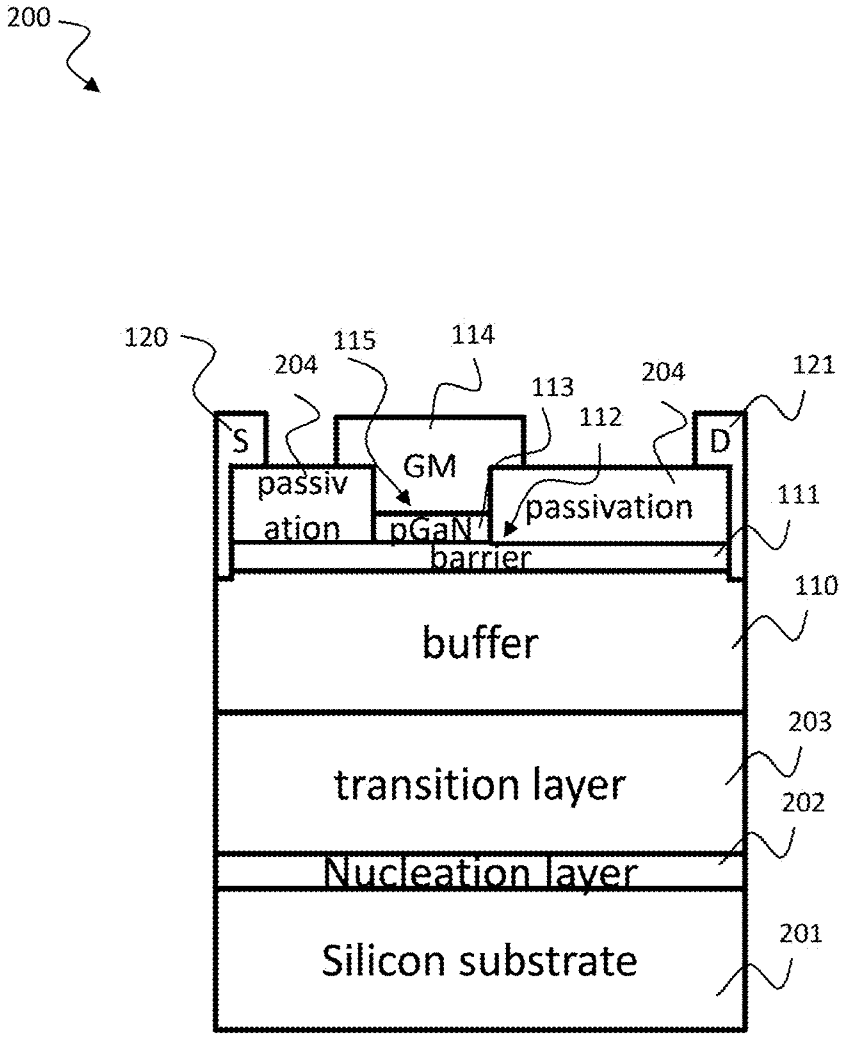
FIG. 2 shows a design of a GaN power transistor 200 with Schottky barrier according to embodiments of the disclosure.

In one example of the transistor 100, the buffer layer 110 may be formed on at least one transition layer (e.g. layers 202, 203 as shown in the Example of FIG. 2) that is formed on a Silicon substrate (e.g. substrate 201 as shown in the Example of FIG. 2).

FIG. 2 shows a design of a GaN power transistor 200 with Schottky barrier according to a second example.

The GaN power transistor 200 may be designed similarly to the transistor 100 described above with respect to FIG. 1.

The GaN power transistor 100 comprises a buffer layer 110; a barrier layer 111 deposited on the buffer layer 110, wherein a gate region 112 is formed on top of the barrier layer 111; a p-type doped GaN layer 113 deposited on the barrier layer 111 at the gate region 112; and a metal gate layer 114 deposited on top of the p-type doped GaN layer 113, wherein the metal gate layer 114 is contacting the p-type doped GaN layer 113 to form a Schottky barrier 115. The buffer layer 110 is formed on a transition layer 203 that is formed on a nucleation layer 202. The nucleation layer 202 is formed on a Silicon substrate 201.

A thickness of the p-type doped GaN layer 113, a metal type of the metal gate layer 114 and a p-type doping concentration of the p-type doped GaN layer 113 are based on a known relationship, e.g. a relationship 400 as shown in FIG. 4, of a pGaN Schottky gate depletion region thickness 401 with respect to a p-type doping concentration 302 and a gate metal type.

A source (S) metal layer 120 and a drain (D) metal layer 121 may be formed laterally to the barrier layer 111. Source metal layer 120 and drain metal layer 121 may be separated by a passivation layer 204 from the pGaN layer 113 and the metal gate layer 114. Source metal layer 120 and drain metal layer 121 may extend to the same height as the metal gate layer 114. Alternatively, source metal layer 120 and drain metal layer 121 may extend to a lower level than the metal gate layer 114, e.g. according to the design shown in FIG. 1.

The buffer layer 110 may comprise a GaN layer or an Aluminum Gallium Nitride, AlGaN, layer. The barrier layer 111 may comprise an AlGaN layer.

In one example of the transistor 200, the thickness of the p-type doped GaN layer 113 may be smaller than 65 nanometers.

In one example of the transistor 200, the metal gate layer 114 may be made of one of the following metals: Al, Ti, TiN, Au, Pd, Ni, W or any combination thereof in a stacked way.

In one example of the transistor 200, the p-type doping concentration of the p-type doped GaN layer 113 may be within a range of 1e18 $cm^{-3}$ and 1e19 $cm^{-3}$.

In one example of the transistor 200, the p-type doped GaN layer 113 may be fully depleted in operation of the GaN power transistor 100.

In one example of the transistor 200, the known relationship (e.g. relationship 400 shown in FIG. 3) of the pGaN Schottky gate depletion region thickness 401 with respect to the p-type doping concentration 402 and the gate metal type may be based on a predetermined dataset, e.g. dataset 403 shown in FIG. 4, that enables a stable operation of the GaN power transistor 200.

In one example of the transistor 200, the predetermined dataset enables an optimum (or improved) operation of the GaN power transistor 100 with respect to static performance, dynamic performance and gate reliability.

During tests with different parameters, it was found that a suitable dataset for a pGaN Schottky gate module can be summarized as follows:

(1) pGaN thickness <65 nm (2) p-type doping concentration: [1e18 $cm^{-3}$-1e19 $cm^{-3}$]

(3) Metal type of the metal gate: Al, Ti, TiN, Au, Pd, Ni, W or any combination thereof in a stacked way In one example of the transistor 200, the transistor 200 may be configured to enable normally-off operation.

In one example of the transistor 200, the p-type doped GaN layer 113 and the metal gate layer 114 may be lithographically defined only in the gate region of the barrier layer 111.

Figure 3:
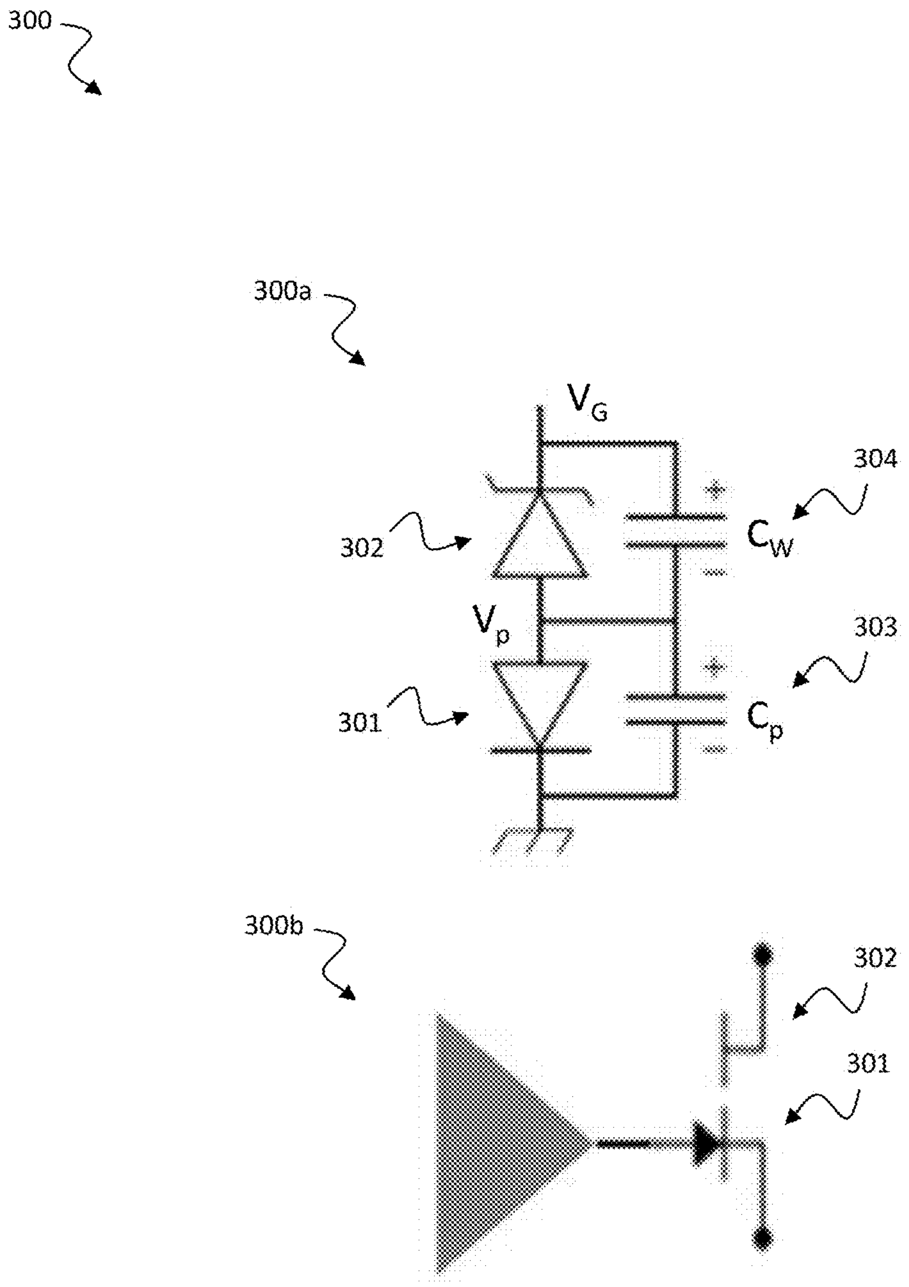
FIG. 3 shows an equivalent circuit design 300 for the gate module of a GaN power transistor with Schottky barrier according to embodiments of the disclosure.

FIG. 3 shows an equivalent circuit design 300 for the gate module of a GaN power transistor with Schottky barrier according to the disclosure.

In the Schottky approach as shown in FIG. 3, a reverse-biased Schottky diode 302 is inserted in series with the pn-pGaN/AlGaN diode 301 as shown in the driving scheme 300*b*. This allows a massive DC gate current reduction, as illustrated in the example of FIG. 3. The series connection of the reverse-biased Schottky diode 302 with its parallel connected capacitance $C_W$ and the pn-pGaN/AlGaN diode 301 with its parallel connected capacitance $C_p$ is illustrated in the equivalent circuit 300*a*.

Threshold voltage instabilities (positive and negative) are observed in the Schottky approach which can make the device more prone to spurious turn-on effects (for negative $V_{TH}$ shift) or degrade the device on-state resistance (for positive $V_{TH}$ shift). A threshold voltage dynamic behavior can be observed for a pGaN Schottky gate, for example in case of positive stress voltage applied to the gate electrode.

Weak gate robustness is also observed for the Schottky approach. A time dependent dielectric breakdown (TDDB) behavior is observed, similarly to the breakage of gate dielectrics in conventional Si-based power devices. Several theories have been proposed to explain the gate failure mechanisms and one possible root cause has been identified as impact ionization effects, within the depletion region of the reversed biased Schottky diode, triggered by electrons injected from the AlGaN barrier into the pGaN layer. Tests with the electric field distribution within the pGaN layer under positive voltage applied to the gate electrode have shown that the maximum electric field is located at the metal/pGaN interface.

Most Schottky gate pGaN approaches today rely on very high doping in the pGaN layer (>5e19 $cm^{-3}$). The typical thickness of the pGaN layer is, generally, between 80 nm and 250 nm. The p-type doping concentration can be extracted via conventional SIMs profile measurements.

It has been demonstrated that holes depletion and accumulation (time dependent and geometry dependent) causes threshold voltage instability. Moreover, the very high doping concentration used in the pGaN layer induces a very narrow depletion region at the metal/pGaN interface. Main drawback of this approach is that the electric field within the narrow depletion region reaches very high values (~5-10 MV/cm) and strongly compromise the overall gate reliability. It is believed that the high electric field in the depletion region causes strong acceleration of electrons injected from the 2DEG into the pGaN layer. Those accelerated electrons can promote carrier multiplication via impact ionization effects and the presence of large number of highly energetic carriers, it is believed to create damages (percolation paths) at the metal/pGaN interface and, eventually, to compromise the overall gate reliability.

Several attempts have been investigated in the past years to improve the gate reliability of pGaN gate modules and to alleviate the threshold voltage instabilities of pGaN Schottky gate. For example, a direct correlation between the static DC gate current and the overall gate reliability has been observed. The reduction of the static gate current, unfortunately, translates into higher threshold voltage instabilities due to the presence of a large amount of floating holes in the pGaN layer that can be injected into the AlGaN barrier and/or recombine with electrons injected from the 2DEG into the pGaN layer, without being replenished by the metal gate electrode.

For the aforementioned reasons, the present disclosure presents a solution how to overcome the above described drawbacks of pGaN Schottky gate modules, which are: Large positive and negative threshold voltage instabilities; and poor gate reliability.

The solution according to the disclosure is to provide exemplary guideline optimization for the Schottky gate module of a p-Gate of a GaN power transistor. A set of precise relationship between the different dimensions and doping concentration of a pGaN gate module is provided in this disclosure that optimizes the overall performance and allows to solve the main issues of state-of-the-art pGaN Schottky gate, i.e. threshold voltage instabilities and gate reliability. A fully depleted pGaN Schottky Gate solution can be achieved by properly dimensioning the pGaN gate geometry in relation to the p-type doping concentration, for example achieved my means of Magnesium doping though any other doping can used as well.

As described above with respect to FIGS. 1 and 2, such a suitable guideline optimization strategy for a pGaN Schottky gate module can include one or more of the following features:

(1) pGaN thickness <65 nm (2) p-type doping concentration: [1e18 $cm^{-3}$-1e19 $cm^{-3}$]

(3) Metal type of the metal gate: Al, Ti, TiN, Au, Pd, Ni, W or any combination thereof in a stacked way FIG. 4 shows an example of design guidelines according to the disclosure for the Schottky interface with respect to depletion region over doping concentration 400.

Figure 6:
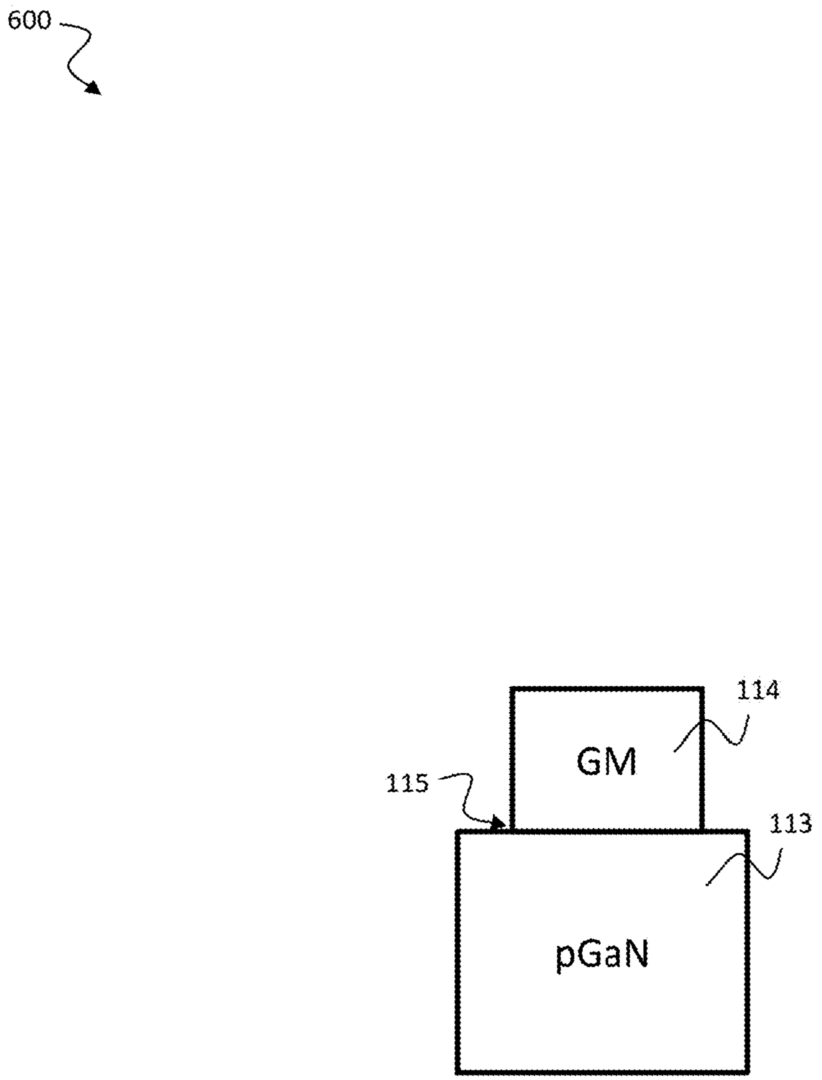
FIG. 6 shows a design of a metal-semiconductor junction 700 of a GaN power transistor according to according to embodiments of the disclosure.

In the example of FIG. 4, the thickness of the depletion region at the metal/pGaN interface, e.g. between the layers 114 and 113 as illustrated in FIGS. 1, 2 and 6, is shown as a function of the p-type doping concentration, e.g. for Mg used as dopant element. However, any other dopant element can be used as well. The thick line 410 with symbols defines the extension of the depletion region formed at the interface between the metal gate 114 and the p-type doped GaN layer 113 underneath as a function of the p-type doping concentration used in the pGaN layer 113, and for a certain metal type of the metal gate 114. FIG. 4 also shows the dependence of the depletion region on the metal type of the metal gate 114 used to create the Schottky interface 115 with the pGaN layer 113 underneath.

FIG. 4 also depicts one horizontal line B and one vertical line A. Those two lines represent the boundaries, together with the depletion region line, of the safe operating area for a Schottky pGaN gate module. In particular, line A represent the threshold p-type doping concentration below which tunnelling events of holes injection from the metal layer into the pGaN layer, are strongly attenuated. Lowering the p-type doping concentration below this threshold value allows also a drastic reduction of the static gate current, under positive voltages applied to the gate electrode.

Line B, on the other side, represents the maximum thickness of the pGaN layer 113 that is suggested in order to have an optimized operation of the pGaN Schottky gate module. This maximum thickness is chosen according to the following main three guidelines criteria:

1) pGaN etching process optimization: metal gate 114 and p-type doped layer 113 may be lithography defined only in the gate region 112. Metal gate 114 and p-type doped layer 113 generally undergo some masking steps followed by etching steps. Etching may be carefully controlled in order to selectively stop at the pGaN/AlGaN barrier interface 113, 111. When this etching step is not properly controlled, an unwanted etch of the AlGaN barrier 111 can occur with consequent degradation of the device performance. The p-type GaN thickness can also affect the selectivity of the etching process.

2) Transconductance optimization: pGaN layer 113 may be minimized in order to boost the device transconductance (gm).

3) Threshold voltage: device threshold voltage increases with increasing pGaN thickness.

Based on the following guidelines for the gate module optimization, the following range of device dimensions and doping concentration is presented in this disclosure that would allow to have an optimum (or improved) operation of the pGaN Schottky gate module. The optimum (or improved) operation is defined in terms of static performance (threshold voltage, gate current), dynamic performance (dynamic threshold voltage) and, last but not least, in terms of improved gate reliability.

In particular, FIG. 4 shows the simulated performance of a pGaN Schottky gate as a function of the voltage applied to the gate electrode and for different values of the p-type doping concentration used in the pGaN layer 113. It is possible to observe how a reduction of the p-type concentration, following the guidelines given below, allows contemporary to suppress the dynamic threshold voltage instabilities and, at the same time, to achieve a drastic reduction of the peak electric field at the metal/pGaN interface 114, 113. The reduction in the peak electric field will translate into a direct improvement in the overall gate module reliability. It is indeed believed that the main reason for Schottky pGaN gate breakdown is triggered by impact ionization events promoted and sustained by the high electric field in the Schottky depletion region.

The depletion region also depends on the metal type of the metal gate.

It has shown that a progressive reduction of the p-type concentration in the pGaN layer 113, together with the geometry optimization of the gate module, can bring outstanding advantages in terms of both threshold voltage instability and reduction of the peak electric field in the pGaN layer.

A suitable guideline optimization strategy for a pGaN Schottky gate module can be summarized as follows:

1. pGaN thickness <65 nm
2. p-type doping concentration: [1e18 $cm^{-3}$-1e19 $cm^{-3}$]
3. Metal type of the metal gate: Al, Ti, TiN, Au, Pd, Ni, W or any combination thereof in a stacked way FIG. 4 shows an exemplary dataset 403 which follows these guidelines.

Figure 5:
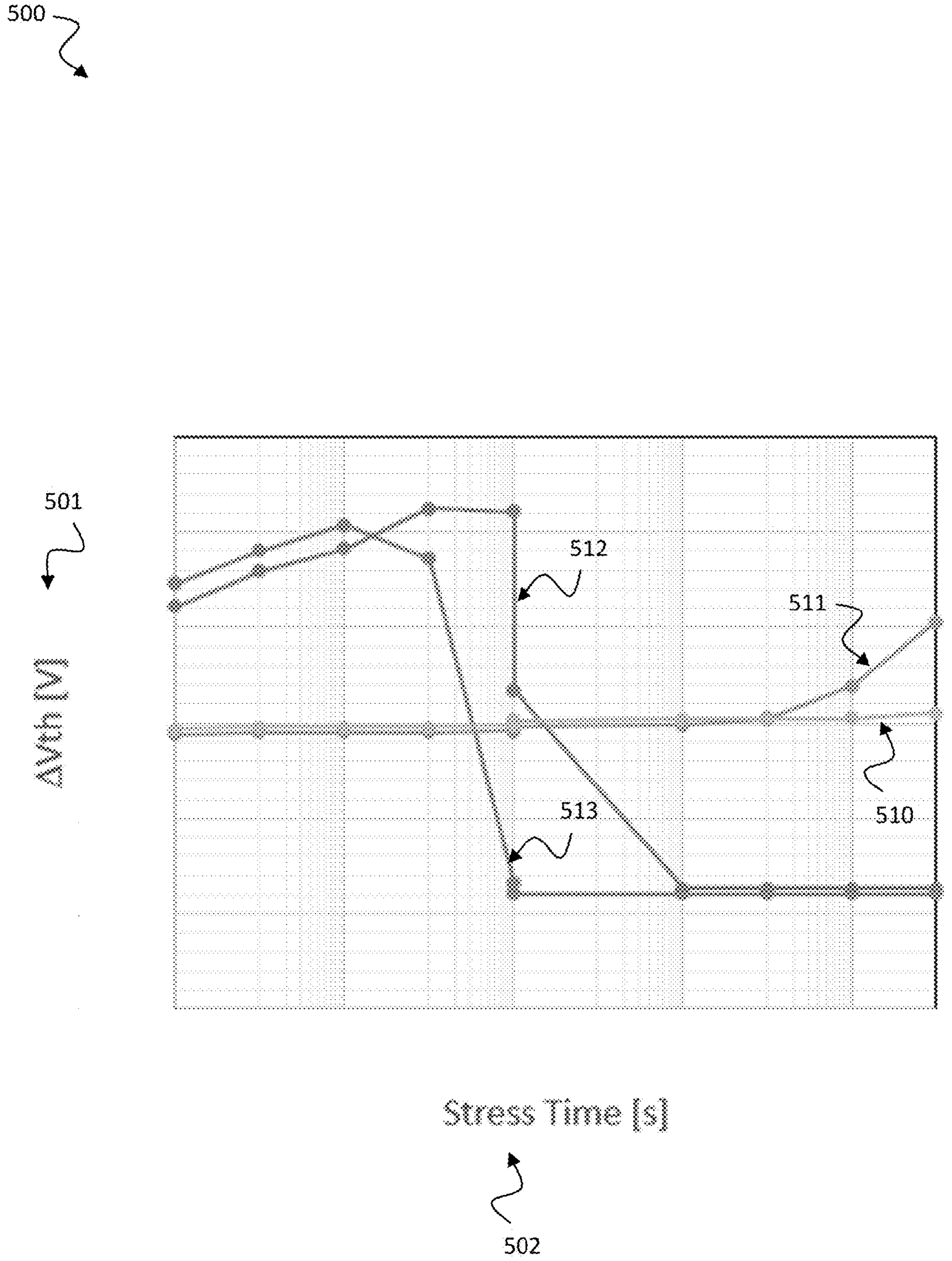
FIG. 5 shows an exemplary performance simulation 500 of the threshold voltage stability for the pGaN Schottky gate as a function of the stress time, according to embodiments of the disclosure.

FIG. 5 shows an exemplary performance simulation 500 of the threshold voltage stability 501 for the pGaN Schottky gate as a function of the stress time 502.

A first graph 510 shows the performance of a pGaN Schottky gate that is designed according to the guidelines described in this disclosure, i.e. having pGaN thickness <65 nm; p-type doping concentration between [1e18 $cm^{-3}$-1e19 $cm^{-3}$] and metal gate type Al, Ti, TiN, Au, Pd, Ni, W or any combination thereof in a stacked way. Its threshold voltage is very stable, also for long stress times 502.

A second graph 511 shows the performance of another pGaN Schottky gate that is designed closely to the guidelines described above. The threshold voltage of graph 511 is also quite stable, small instabilities occur only after long stress times 502.

A third graph 512 and a fourth graph 513 are not designed according to the guidelines of this disclosure. Instead a common design is used relying on very high doping in the pGaN layer (>5e19 $cm^{-3}$) and having a thickness of the pGaN layer between 80 nm and 250 nm. The threshold voltage of both graphs 512 and 513 shows instable behavior from the beginning.

FIG. 6 shows a design of a metal-semiconductor junction 600 of a GaN power transistor according to an example. The metal-semiconductor junction 600 may be implemented in a GaN power transistor 100 as shown in FIG. 1 or a GaN power transistor 200 as shown in FIG. 2, for example.

The metal-semiconductor junction 600 comprises: a p-type doped GaN layer 113; and a metal gate layer 114 deposited on top of the p-type doped GaN layer 113. The metal gate layer 114 is contacting the p-type doped GaN layer 113 to form a Schottky barrier 115. A p-type doping concentration of the p-type doped GaN layer 113 is within a range of 1e18 $cm^{-3}$ and 1e19 $cm^{-3}$.

A thickness of the p-type doped GaN layer 113 may be smaller than 65 nanometers.

The metal gate layer 114 can be made of one of the following metals: Al, Ti, TiN, Au, Pd, Ni, W or any combination thereof in a stacked way.

The thickness of the p-type doped GaN layer 113, a metal type of the metal gate layer 114 and a p-type doping concentration of the p-type doped GaN layer 113 can be based on a known relationship 400 of a pGaN Schottky gate depletion region thickness 401 with respect to a p-type doping concentration 402 and a gate metal type as shown in FIG. 4 and described above with respect to FIGS. 1 and 2.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms “include”, “have”, “with”, or other variants thereof are used in either the detailed description or the claims, such terms are intended to be inclusive in a manner similar to the term “comprise”. Also, the terms “exemplary”, “for example” and “e.g.” are merely meant as an example, rather than the best or optimal. The terms “coupled” and “connected”, along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the embodiments of the invention has been described with reference to one or more particular embodiments, those skilled in the art recognize that many changes may be made thereto without departing from the scope of the embodiments of the invention. It is therefore to be understood that within the scope of the appended claims and their equivalents, the invention may be practiced otherwise than as specifically described herein.

What is claimed is:

1. A Gallium Nitride (GaN) power transistor, the GaN power transistor comprising:
- a buffer layer;
- a barrier layer deposited directly on the buffer layer such that the barrier layer contacts the buffer layer, wherein a gate region is formed on top of the barrier layer;
- a p-type doped GaN layer deposited on the barrier layer at the gate region; and
- a metal gate layer deposited on top of the p-type doped GaN layer, wherein the metal gate layer is contacting the p-type doped GaN layer to form a Schottky barrier,
- wherein a thickness of the p-type doped GaN layer, a metal type of the metal gate layer and a p-type doping concentration of the p-type doped GaN layer are based on a known relationship of a pGaN Schottky gate depletion region thickness with respect to a p-type doping concentration and a gate metal type.

2. The GaN power transistor according to claim 1,
wherein the thickness of the p-type doped GaN layer is smaller than 65 nanometers.

3. The GaN power transistor according to claim 1,
wherein the metal gate layer is made of any one of the following metals: aluminium (Al), titanium (Ti), Titanium nitride (TiN), gold (Au), palladium (Pd), nickel (Ni), tungsten (W) or any combination thereof in a stacked way.

4. The GaN power transistor according to claim 1,
wherein the p-type doping concentration of the p-type doped GaN layer is within a range of 1e18 $cm^{-3}$ and 1e19 $cm^{-3}$.

5. The GaN power transistor according to claim 1,
wherein the p-type doped GaN layer is fully depleted in operation of the GaN power transistor.

6. The GaN power transistor according to claim 1,
wherein the known relationship of the pGaN Schottky gate depletion region thickness with respect to the p-type doping concentration and the gate metal type is based on a predetermined dataset that enables a stable operation of the GaN power transistor.

7. The GaN power transistor according to claim 6,
wherein the predetermined dataset enables an optimum operation of the GaN power transistor with respect to static performance, dynamic performance and gate reliability.

8. The GaN power transistor according to claim 1 configured to enable normally-off operation.

9. The GaN power transistor according to claim 1,
wherein the p-type doped GaN layer and the metal gate layer are lithographically defined only in the gate region of the barrier layer.

10. The GaN power transistor according to claim 1,
wherein the buffer layer comprises a GaN layer or an Aluminum Gallium Nitride (AlGaN) layer.

11. The GaN power transistor according to claim 1,
wherein the barrier layer comprises an Aluminum Gallium Nitride (AlGaN) layer.

12. The GaN power transistor according to claim 1,
wherein the buffer layer is formed on at least one transition layer that is formed on a silicon substrate.

13. A metal-semiconductor junction of a Gallium Nitride (GaN) power transistor, the metal-semiconductor junction comprising:
a p-type doped GaN layer, wherein a thickness of the p-type doped GaN layer is smaller than 65 nanometers, wherein the p-type doped GaN layer is deposited on a barrier layer, and wherein the barrier layer is deposited directly on and contacts a buffer layer; and
a metal gate layer deposited on top of the p-type doped GaN layer,
wherein the metal gate layer is contacting the p-type doped GaN layer to form a Schottky barrier,
wherein a p-type doping concentration of the p-type doped GaN layer is within a range of 1e18 $cm^{-3}$ and 1e19 $cm^{-3}$.

14. The metal-semiconductor junction according to claim 13,
wherein the metal gate layer is made of any one of the following metals: aluminium (Al), titanium (Ti), Titanium nitride (TiN), gold (Au), palladium (Pd), nickel (Ni), tungsten (W) or any combination thereof in a stacked way.

15. The GaN power transistor according to claim 1, further comprising:
a source metal layer formed laterally on a first side of the barrier layer; and
a drain metal layer formed laterally on a second side of the barrier layer.

16. The GaN power transistor according to claim 15, wherein the source metal layer is separated from the metal gate layer and the p-type doped GaN layer using a passivation layer.

17. The GaN power transistor according to claim 15, wherein the drain metal layer is separated from the metal gate layer and the p-type doped GaN layer using a passivation layer.

18. The GaN power transistor according to claim 15, wherein the source metal layer and the drain metal layer extend to a height greater than the metal gate layer, and wherein the source metal layer and the drain metal layer partially extend into the barrier layer.

19. A Gallium Nitride (GaN) power transistor, the GaN power transistor comprising:
a buffer layer;
a barrier layer deposited directly on the buffer layer such that the barrier layer contacts the buffer layer, wherein a gate region is formed on top of the barrier layer;
a p-type doped GaN layer deposited on the barrier layer at the gate region; and
a metal gate layer deposited on top of the p-type doped GaN layer, wherein the metal gate layer is contacting the p-type doped GaN layer to form a Schottky barrier,
wherein a thickness of the p-type doped GaN layer, a metal type of the metal gate layer and a p-type doping concentration of the p-type doped GaN layer are based on a known relationship of a pGaN Schottky gate depletion region thickness with respect to a p-type doping concentration and a gate metal type,
wherein the thickness of the p-type doped GaN layer is smaller than 65 nanometers,
wherein the metal gate layer is made of any one of the following metals: aluminium (Al), titanium (Ti), Titanium nitride (TiN), gold (Au), palladium (Pd), nickel (Ni), tungsten (W) or any combination thereof in a stacked way,
wherein the p-type doping concentration of the p-type doped GaN layer is within a range of 1e18 $cm^{-3}$ and 1e19 $cm^{-3}$.

20. The GaN power transistor according to claim 1,
wherein the metal gate layer consists of one or more metal layers selected from Al, Ti, TiN, Au, Pd, Ni, and W, or any combination thereof in a stacked way, and a bottom surface of the metal gate layer is deposited on and directly contacting a top surface of the p-type doped GaN layer,
wherein a bottom surface of the p-type doped GaN layer is directly contacting a top surface of the barrier layer,
wherein a bottom surface of the barrier layer directly contacts a top surface of the buffer layer.

* * * * *